United States Patent
Sridhara

(10) Patent No.: US 8,390,329 B1
(45) Date of Patent: Mar. 5, 2013

(54) METHOD AND APPARATUS TO COMPENSATE FOR HOLD VIOLATIONS

(75) Inventor: Srinivasa R. Sridhara, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/323,559

(22) Filed: Dec. 12, 2011

(51) Int. Cl.
H03K 19/096 (2006.01)
H03K 17/16 (2006.01)
H03K 19/003 (2006.01)
H03L 7/00 (2006.01)

(52) U.S. Cl. .............................. 326/97; 326/26; 327/161

(58) Field of Classification Search ................... 326/97, 326/26, 27, 31, 32; 327/291–297, 299, 171
See application file for complete search history.

(56) References Cited

U.S. PATENT DOCUMENTS

| | | | |
|---|---|---|---|
| 6,262,612 B1 | 7/2001 | Svensson et al. | |
| 6,906,555 B2 * | 6/2005 | Ma ................................ | 326/94 |
| 7,944,327 B2 * | 5/2011 | Kravchenko et al. ......... | 333/185 |
| 7,978,004 B2 | 7/2011 | Houston et al. | |
| 2001/0015665 A1 | 8/2001 | Choi | |
| 2002/0178427 A1 * | 11/2002 | Ding et al. ....................... | 716/12 |
| 2003/0058017 A1 | 3/2003 | Humphrey | |
| 2003/0214340 A1 * | 11/2003 | Tomsio et al. ................. | 327/295 |
| 2007/0136708 A1 * | 6/2007 | Overs et al. ....................... | 716/6 |
| 2008/0071489 A1 * | 3/2008 | Wissel .............................. | 702/79 |
| 2008/0129357 A1 * | 6/2008 | Chlipala et al. ................ | 327/161 |
| 2008/0278223 A1 | 11/2008 | Kernahan et al. | |
| 2011/0239069 A1 * | 9/2011 | Ramaraju et al. ............. | 714/731 |
| 2011/0296265 A1 * | 12/2011 | Rakheja et al. ................ | 714/731 |
| 2012/0126869 A1 * | 5/2012 | Payne et al. .................... | 327/161 |

FOREIGN PATENT DOCUMENTS

EP 2320565 5/2011

OTHER PUBLICATIONS

U.S. Appl. No. 13/195,020, filed Aug. 1, 2011.

* cited by examiner

*Primary Examiner* — Shawki Ismail
*Assistant Examiner* — Dylan White
(74) *Attorney, Agent, or Firm* — Alan A. R. Cooper; Wade J. Brady, III; Frederick J. Telecky, Jr.

(57) ABSTRACT

A method for controlling a hold buffer delay is provided. A control voltage is generated in response to a measurement of at least one of process variation, temperature variation, and supply voltage variation to compensate for a hold violation, and the delay of a buffer is adjusted using the control voltage. A first data signal is provided in synchronization with a first clock signal. A logic operation is performed on the first signal so as to generate a second data signal. A third data signal is generated and outputted in synchronization with a second clock signal, and at least one of the first and second data signals is buffered with the buffer.

21 Claims, 4 Drawing Sheets

METHOD AND APPARATUS TO COMPENSATE FOR HOLD VIOLATIONS

TECHNICAL FIELD

The invention relates generally to circuitry to compensate for hold violations and, more particularly, to circuitry to compensate for hold violation over process, temperature, and supply voltage variation.

BACKGROUND

Turning to FIG. 1, an example of a conventional system 100 can be seen. In this system 100, input data IN is provided to flip-flop 102. Flip-flop 102 can then generate an output signal for logic 104 in synchronization with an edge of clock signal CLK1 (which is generated from clock signal MCLK by clock tree 110). Logic 104 can then process the output from flip-flop 102, and the output of logic 104 can be provided to buffer 106. Here, buffer 106 is included to include a minimum path length to ensure that no output from logic 104 reaches flip-flop 108 prior to the generation of a corresponding phase or edge of clock signal CLK2 by tree 112 (which is also commonly referred to as a "hold violation"). As a result, the buffer 106 operates as a "hold buffer" that generally eliminates hold violations.

Use of hold buffers (like buffer 106) are very common and have worked very well in conventional applications, but there is an ever-increasing desire to reduce power consumption due at least in part to the increasing use of mobile products that employ batteries as a power sources. With this desire to decrease power consumption, operations of systems (such as system 100) in sub-threshold voltage ranges is becoming desirable. When operating in sub-threshold voltage ranges, though, hold buffers (i.e., buffer 106) can become problematic because the hold buffers (i.e., buffer 106) will increase the largest path length as well as the shortest path length, which can significantly degrade performance under some circumstances. Additionally, these hold buffers can further degrade performance when there are significant process and temperature variations coupled with use of supply voltages within sub-threshold ranges. Therefore, there is a need for a method and/or apparatus that compensates for hold violations within both super-threshold and sub-threshold supply voltage ranges.

Some examples of conventional systems are: U.S. Pat. No. 6,262,612; U.S. Pat. No. 7,978,004; U.S. Patent Pre-Grant Publ. No. 2001/0015665; U.S. Patent Pre-Grant Publ. No. 2003/0058017; U.S. Patent Pre-Grant Publ. No. 2008/0278223; and European Patent No. EP2320565.

SUMMARY

An embodiment of the present invention, accordingly, provides an apparatus. The apparatus comprises a clocking circuit that is configured to generate first and second clock signals from a third clock signal; an input circuit that is coupled to the clocking circuit so as to receive the first clock signal; logic that is coupled to the input circuit; an output circuit that is coupled to the clocking circuit so as to receive the second clock signal; a buffer having a plurality of inverters coupled in series with one another between the logic and at least one of input circuit and the output circuit; and a controller that is configured to generate a control voltage in response to a measurement of at least one of process variation, temperature variation, and supply voltage variation and that is coupled to provide the control voltage to the buffer so as to adjust the delay of at least one of the inverters.

In accordance with an embodiment of the present invention, the apparatus further comprises: a first supply rail that is coupled to the clocking circuit, the input circuit, the output circuit, the logic, each inverter, and the controller; a second supply rail that is coupled to the clocking circuit, the input circuit, the output circuit, the logic, each inverter, and the controller; and a third supply rail that is coupled to the controller.

In accordance with an embodiment of the present invention, each inverter further comprises: a PMOS transistor that is coupled to the first supply rail at its source; and a NMOS transistor that is coupled to the gate of the PMOS transistor at its gate, that is coupled to the drain of the PMOS transistor at its drain, and that is coupled to the second supply rail at it source.

In accordance with an embodiment of the present invention, the controller is coupled to provide the control voltage to the body of the PMOS transistor for at least one of the inverters.

In accordance with an embodiment of the present invention, the PMOS transistor further comprises a first PMOS transistor, and wherein each inverter further comprises a header having a second PMOS transistor coupled between the first supply rail and the first PMOS transistor, and wherein the second PMOS transistor is coupled to the controller at its gate so as to receive the control voltage.

In accordance with an embodiment of the present invention, the NMOS transistor further comprises a first NMOS transistor, and wherein each inverter further comprises a footer having a second NMOS transistor coupled between the second supply rail and the first NMOS transistor, and wherein the second NMOS transistor is coupled to the controller at its gate so as to receive the control voltage.

In accordance with an embodiment of the present invention, the controller further comprises: a voltage measurement circuit that is configured to measure the supply voltage variation on the first supply rail; and an adjustment circuit that is coupled to the voltage measurement circuit, wherein the adjustment circuit is configured to adjust the control voltage so as to slow at least one of the inverters when the voltage on the first supply rail is within a range, where hold violations may occur.

In accordance with an embodiment of the present invention, the controller further comprises: a process measurement circuit that is configured to measure the process variation of the apparatus and that is coupled to the adjustment circuit; and a temperature measurement circuit that is configured to measure the temperature variation and that is coupled to the adjustment circuit.

In accordance with an embodiment of the present invention, the input circuit is a static random access memory (SRAM).

In accordance with an embodiment of the present invention, the input circuit is a latch.

In accordance with an embodiment of the present invention, a method is provided. The method comprises generating a control voltage in response to a measurement of at least one of process variation, temperature variation, and supply voltage variation to compensate for a hold violation; adjusting the delay of a buffer using the control voltage; providing a first data signal in synchronization with a first clock signal; performing a logic operation on the first signal so as to generate a second data signal; generating and outputting a third data signal in synchronization with a second clock signal; and buffering at least one of the first and second data signals with the buffer.

In accordance with an embodiment of the present invention, the step of generating the control voltage further comprises: determining whether a supply voltage is within a range where hold violations may occur; and determining the magnitude of the control voltage to compensate for the hold violation.

In accordance with an embodiment of the present invention, the step of generating the control voltage further comprises: determining the process variation; and determining the magnitude of the control voltage to compensate for the hold violation.

In accordance with an embodiment of the present invention, the step of determining the process variation further comprises measuring the operation of a ring oscillator.

In accordance with an embodiment of the present invention, the step of determining the process variation further comprises: generating a test pattern; and determining the process variation based on use of the logic operation on the test pattern.

In accordance with an embodiment of the present invention, the step of generating the control voltage further comprises: determining the temperature variation with a bandgap circuit; and determining the magnitude of the control voltage to compensate for the hold violation.

In accordance with an embodiment of the present invention, an apparatus is provided. The apparatus comprises a first supply rail; a second supply rail; a third supply rail; a first clock tree that is configured to generate a first clock signals from a third clock signal and that is coupled to the first and second supply rails; a second clock tree that is configured to generate a second clock signals from the third clock signal and that is coupled to the first and second supply rails; an input circuit that is coupled to the first clock tree so as to receive the first clock signal and that is coupled to the first and second supply rails; logic that is coupled to the input circuit, the first supply rail, and the second supply rail; an output circuit that is coupled to the second clock tree so as to receive the second clock signal and that is coupled to the first and second supply rails; a buffer including: a first inverter having: a first PMOS transistor that is coupled to the first supply rail at its source and that is coupled to the at least one of the input circuit and the logic at its gate; and a first NMOS transistor that is coupled to the gate of the PMOS transistor at its gate, that is coupled to the drain of the first PMOS transistor at its drain, and that is coupled to the second supply rail at it source; and a second inverter having: a second PMOS transistor that is coupled to the first supply rail at its source, that is coupled the drain of the first PMOS transistor at its gate, and that is coupled to at least one of the logic and the output circuit at its drain; and a second NMOS transistor that is coupled to the gate of the second PMOS transistor at its gate, that is coupled to the drain of the second PMOS transistor at its drain, and that is coupled to the second supply rail at it source; a controller that is configured to generate a control voltage in response to a measurement of at least one of process variation, temperature variation, and supply voltage variation and that is coupled to provide the control voltage to the buffer so as to adjust the delay of at least one of the first and second inverters.

In accordance with an embodiment of the present invention, the controller is coupled to provide the control voltage to the body of the first and second PMOS transistors.

In accordance with an embodiment of the present invention, the first inverter further comprises a third PMOS transistor coupled between the first supply rail and the first PMOS transistor, and wherein the third PMOS transistor is coupled to the controller at its gate so as to receive the control voltage, and wherein the second inverter further comprises a fourth PMOS transistor coupled between the first supply rail and the second PMOS transistor, and wherein the fourth PMOS transistor is coupled to the controller at its gate so as to receive the control voltage.

In accordance with an embodiment of the present invention, the first inverter further comprises a third NMOS transistor coupled between the second supply rail and the first NMOS transistor, and wherein the third NMOS transistor is coupled to the controller at its gate so as to receive the control voltage, and wherein the second inverter further comprises a fourth NMOS transistor coupled between the second supply rail and the second NMOS transistor, and wherein the fourth NMOS transistor is coupled to the controller at its gate so as to receive the control voltage.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
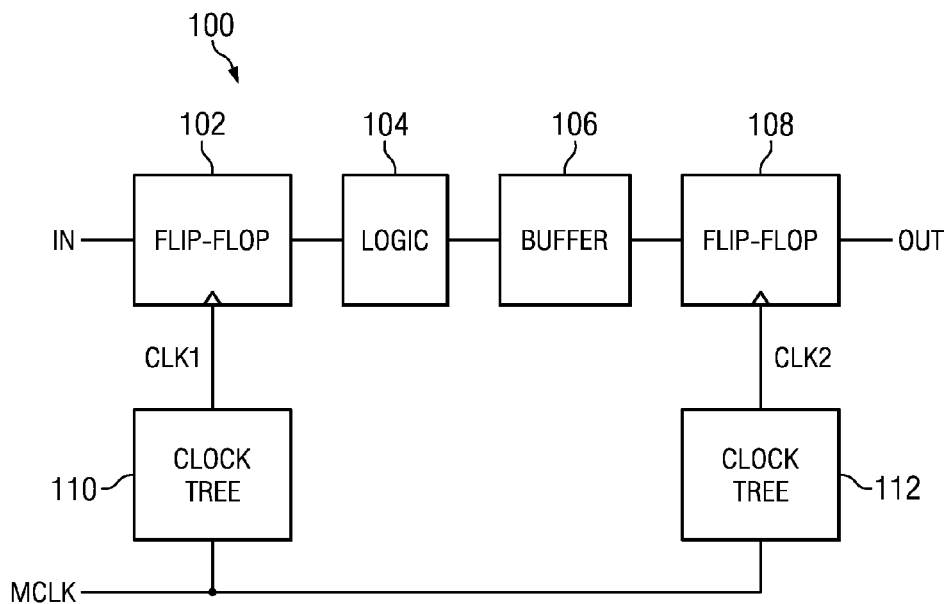
FIG. 1 is a diagram of an example of a conventional system.

Refer now to the drawings wherein depicted elements are, for the sake of clarity, not necessarily shown to scale and wherein like or similar elements are designated by the same reference numeral through the several views.

Figure 2:
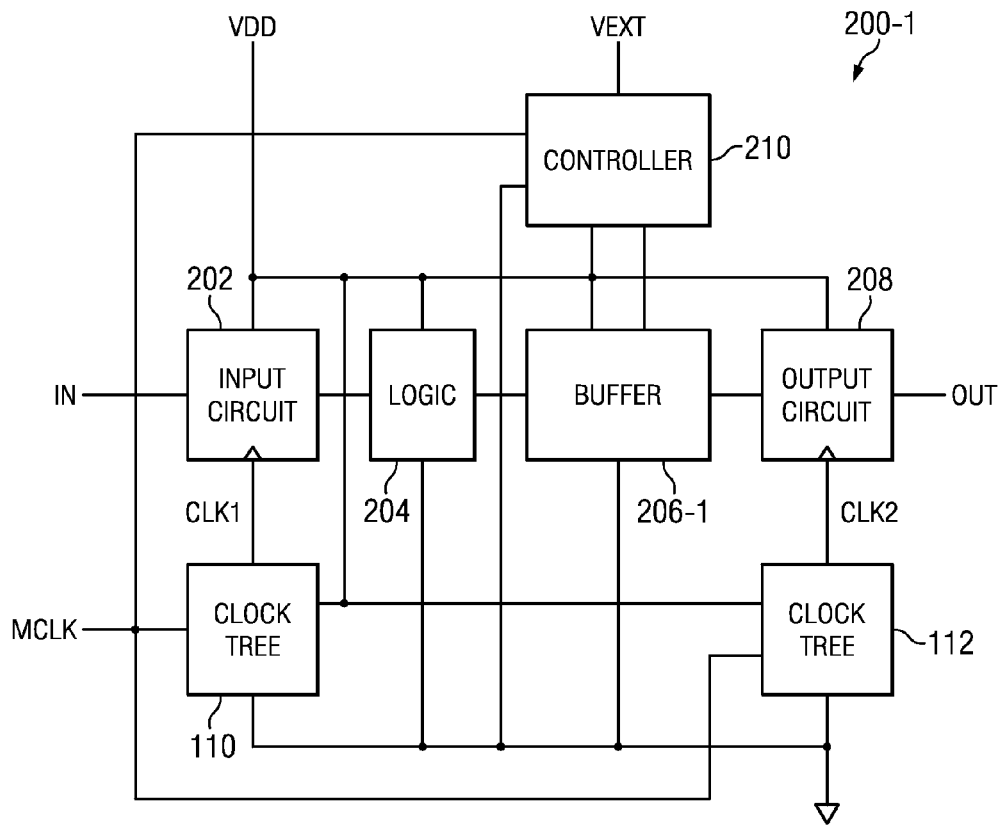
FIGS. 2 and 3 are diagrams of examples of systems in accordance with the present invention.
Figure 3:
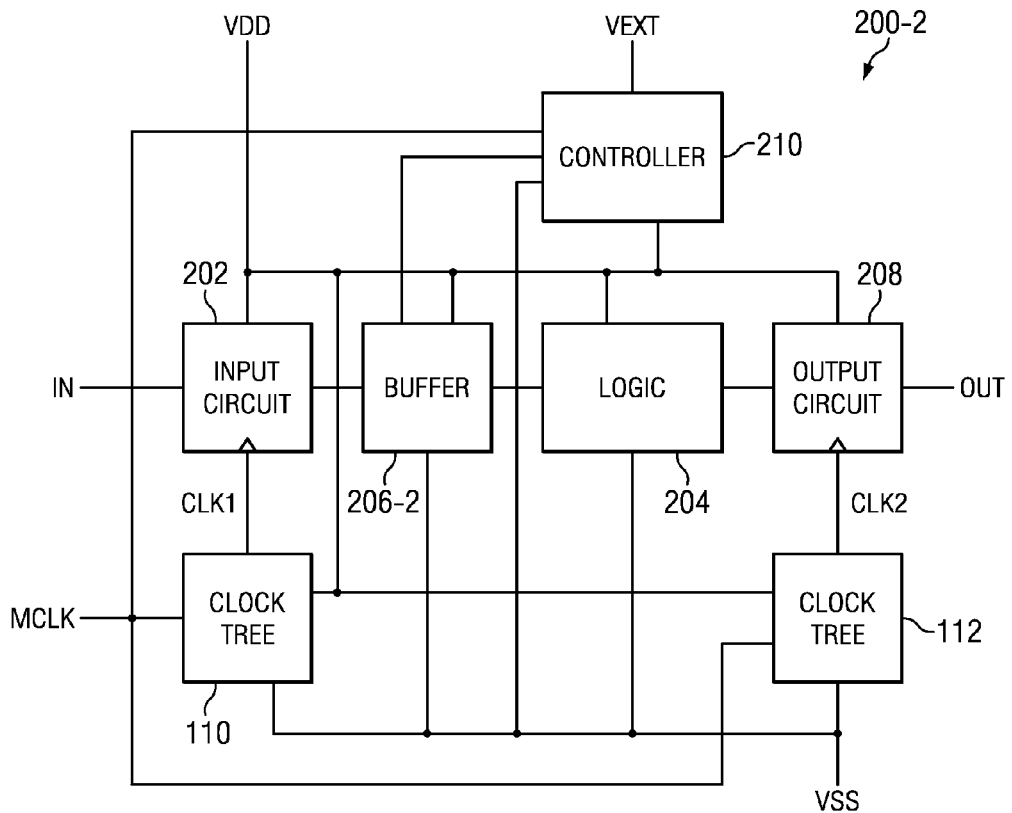

Turning to FIGS. 2 and 3, examples of systems 200-1 and 200-2 in accordance with the present invention can be seen. In these examples, systems 200-1 and 200-2 operate in a similar manner to system 100. Namely, input data IN is provided to input circuit 202. Input circuit 202 can then generate an output signal for logic 204 in synchronization with an edge of clock signal CLK1 (which is generated from clock signal MCLK by clock tree 110). Logic 204 (which generally performs a logic operation) can then process the output from input circuit 202, and the output of logic 204 can be provided to output circuit 208. Output circuit 208 is then able to generate the output data OUT in synchronization with the corresponding phase or edge of clock signal CLK2 by tree 112. Interposed between the logic 204 and output circuit 208 is buffer 206-1 (as shown in FIG. 2), and interposed between logic 204 and input circuit 202 is buffer 206-2 (as shown in FIG. 2). These buffers 206-1 and 206-2 can then function as hold buffers to compensate for hold violations.

Figure 4:
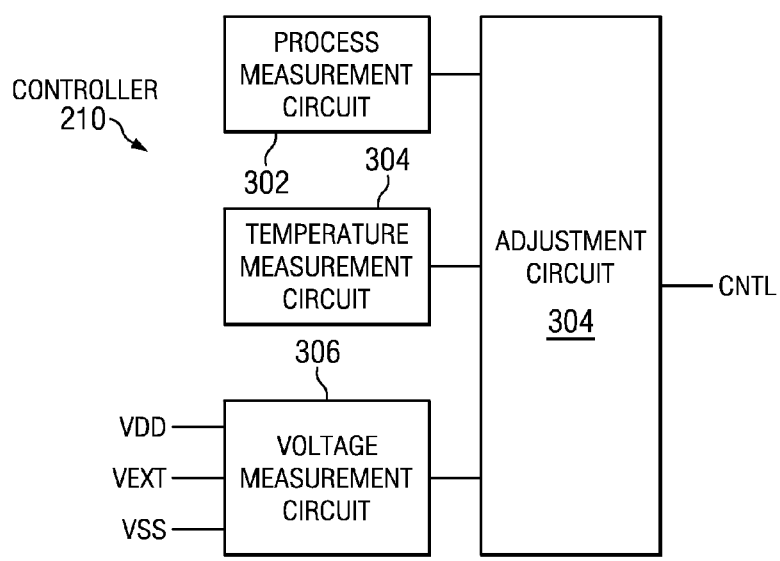
FIG. 4 is a diagram of an example of the controller of FIGS. 2 and 3.

Also included within system 200-1 (which is not present in system 100) is a controller 210 (which can be seen in greater detail in FIG. 4). This controller 210 is able to provide a control voltage CNTL (which is an analog control and which is generally a function of supply voltage variation, process variation, or temperature variation) to buffer 206-1 and/or 206-2 so as to adjust the delay associated with the buffer 206-1 and/or 206-2. Typically, the controller 210 has a voltage measurement circuit 306 that is coupled to supply rails VDD, VSS, and VEXT so as to determined when the supply voltage on supply rail VDD is within range that may cause hold violations (i.e., within a super-threshold or sub-threshold range), and, based on this measurement and the performance of the system 200-1 and/or 200-2, the adjustment circuit 304 can generate an appropriate control voltage CNTL. Additionally, the controller 210 can include a process measurement circuit 302 and temperature measurement circuit 304 that are able to measure process and temperature variation. As an example, the process measurement circuit 302 can include a ring oscillator or can generate a test pattern for logic 204, and, as an example, the temperature measurement circuit 304 can include a bandgap circuit.

Figures 5, 6:
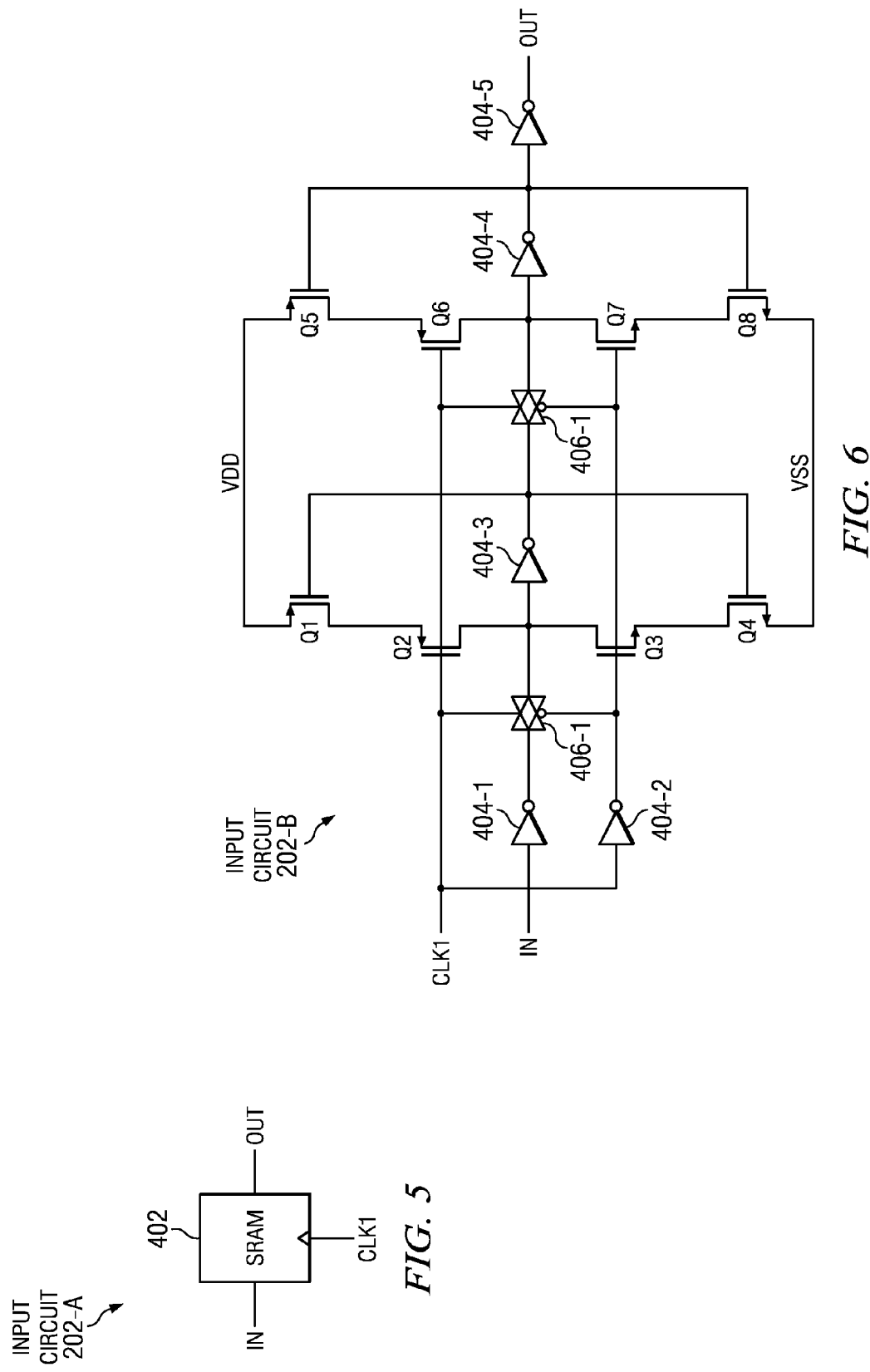
FIGS. 5 and 6 are diagrams of examples of the input circuit of FIGS. 2 and 3.

Generally, there are a variety of circuits that can be used as the input circuit 202 and output circuit 208 where use of buffers 206-1 and/or 206-2 and controller 210 may be appropriate. One example of a circuit that can be used as input circuit 202-A (as shown in FIG. 5) is a static random access memory (SRAM), and another example of a circuit that can be used as input circuit 202-B (as shown in FIG. 5) is a latch (or several latches). Looking to the input circuit 202-B, specifically, the example latch is a master-slave latch that is clocked by clock signal CLK1 and its inverse (which is generated by inverter 402-2), where the clock signal CLK1 and its inverse are provided to passgates or transmission gates 406-1 and 406-2 and the gates of transistors Q2, Q3, Q6, and Q7 (which, for example, can be NMOS and PMOS transistors). In this example arrangement, inverters 404-1 and 404-5 provide isolation, and inverters 404-3 and 404-4 and transistors Q1, Q4, Q5, and Q8 (which, for example, can be NMOS and PMOS transistors) operate as the latching elements.

Figure 7:
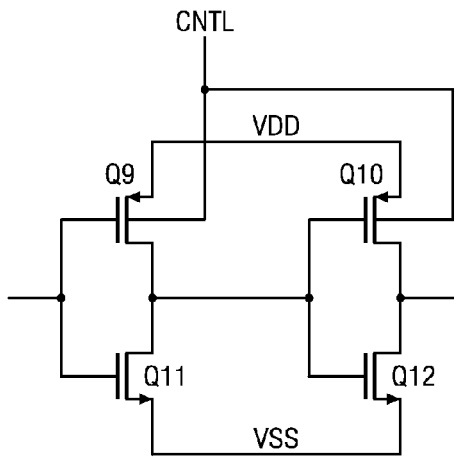
FIGS. 7-9 are diagrams of examples of the buffer of FIGS. 2 and 3.
Figure 8:
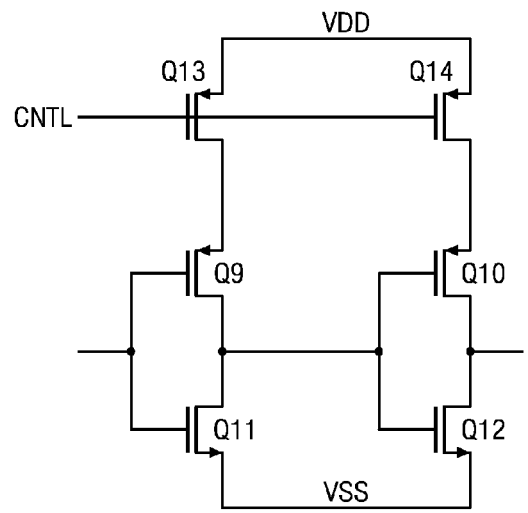
Figure 9:
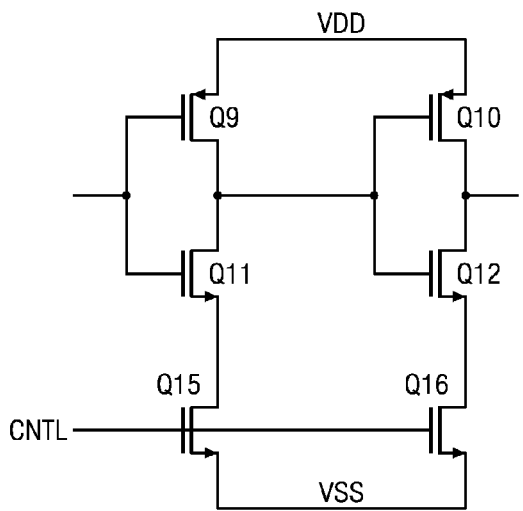

To be able to be controlled with an analog control (i.e., control voltage CNTL), buffers 206-1 and 206-2 can take a variety of different forms (examples of which are shown in FIGS. 7-9). With each of these example implementations, inverter strings (i.e., inverters coupled in series with one another) are employed, and, as an example, two inverter are shown (fewer or more inverters may also be employed). As shown, the inverter string is generally comprised of transistors Q9 to Q12 (which, for example, can be NMOS and PMOS transistors) that are coupled between rails VDD and VSS. The delays through the inverters (and consequently the buffers 206-1 and/or 206-2) can then be varied by the control voltage CNTL.

Looking first to the implementation shown in FIG. 7, because transistors Q9 and Q10 in this example are PMOS transistors, each has an NWell (which is generally an n-type doped well) that forms the body of the transistors Q9 and Q10. By adjusting the voltage applied to the body (also known as the back-gate voltage or body bias) the threshold voltage of transistors Q9 and Q10 can be changed. Typically, when the back-gate voltage of transistors Q9 and Q10 is greater than the supply voltage (which is provided by supply rail VDD) in this example, the delay for each inverter is increased. So, assuming, for example, that the system 200-1 and/or 200-2 is intended to operate at a super-threshold supply voltage of about 1.2V for high switching speeds (i.e., >1 MHz) and to operate at a sub-threshold range of about 0.5V for low switching speeds (i.e., <1 MHz), the control voltage CNTL can be about 1.2V and about 0.5V when a "small" delay is desired for the super-threshold and sub-threshold ranges (respectively), and the control voltage CNTL can be about 1.2V when operating in the sub-threshold range if a "large" delay is desired.

One issue with the arrangement shown in FIG. 7, however, is that area may be sacrificed, so, alternatively, headers, footers, or both can be employed, as shown in FIGS. 8 and 9, that current-starve the inverters to increase delay. Looking first to the header shown in FIG. 8, PMOS transistors Q13 and Q14 are coupled between rail VDD and transistors Q9 and Q10 (respectively), and the control voltage CNTL can be used to control the current through the inverters (i.e., transistors Q9 to Q12). Using the same assumptions for the example described with respect to FIG. 7, the control voltage CNTL can, for example, be about 0V when a "small" delay is desired for both the super-threshold and sub-threshold ranges, and the control voltage CNTL can, for example, be about 0.2V when operating in the sub-threshold range if a "large" delay is desired. Similarly, for the implementation shown in FIG. 9, NMOS transistors Q15 and Q16 are coupled between transistors Q11 and Q12 (respectively) and rail VSS with the control voltage CNTL being used to control the current through the inverters (i.e., transistors Q9 to Q12). Again, using the same assumptions for the example described with respect to FIG. 7, the control voltage CNTL can, for example, be about be about 1.2V and about 0.5V when a "small" delay is desired for the super-threshold and sub-threshold ranges (respectively), and the control voltage CNTL can, for example, be about 0.2V when operating in the sub-threshold range if a "large" delay is desired. Additionally, for an implementation that uses both a header and footer (not shown) separate control signals (i.e., CNTL) for header and footer would typically be used. The control voltage CNTL can also be varied depending on the temperature and process variation

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
   a clocking circuit that is configured to generate first and second clock signals from a third clock signal;
   an input circuit that is coupled to the clocking circuit so as to receive the first clock signal;
   logic that is coupled to the input circuit;
   an output circuit that is coupled to the clocking circuit so as to receive the second clock signal;
   a buffer having a plurality of inverters coupled in series with one another between the logic and at least one of input circuit and the output circuit; and
   a controller that is configured to generate a control voltage in response to a measurement of at least one of process variation, temperature variation, and supply voltage variation and that is coupled to provide the control voltage to the buffer so as to adjust the delay of at least one of the inverters.

2. The apparatus of claim 1, wherein the apparatus further comprises:
   a first supply rail that is coupled to the clocking circuit, the input circuit, the output circuit, the logic, each inverter, and the controller;
   a second supply rail that is coupled to the clocking circuit, the input circuit, the output circuit, the logic, each inverter, and the controller; and
   a third supply rail that is coupled to the controller.

3. The apparatus of claim 2, wherein each inverter further comprises:
   a PMOS transistor that is coupled to the first supply rail at its source; and
   a NMOS transistor that is coupled to the gate of the PMOS transistor at its gate, that is coupled to the drain of the PMOS transistor at its drain, and that is coupled to the second supply rail at it source.

4. The apparatus of claim 3, wherein the controller is coupled to provide the control voltage to the body of the PMOS transistor for at least one of the inverters.

5. The apparatus of claim 3, wherein the PMOS transistor further comprises a first PMOS transistor, and wherein each inverter further comprises a header having a second PMOS transistor coupled between the first supply rail and the first PMOS transistor, and wherein the second PMOS transistor is coupled to the controller at its gate so as to receive the control voltage.

6. The apparatus of claim 5, wherein the controller further comprises:
   a voltage measurement circuit that is configured to measure the supply voltage variation on the first supply rail; and
   an adjustment circuit that is coupled to the voltage measurement circuit, wherein the adjustment circuit is configured to adjust the control voltage so as to slow at least one of the inverters when the voltage on the first supply rail is within a range, where hold violations may occur.

7. The apparatus of claim 6, wherein the controller further comprises:
   a process measurement circuit that is configured to measure the process variation of the apparatus and that is coupled to the adjustment circuit; and
   a temperature measurement circuit that is configured to measure the temperature variation and that is coupled to the adjustment circuit.

8. The apparatus of claim 7, wherein the input circuit is a static random access memory (SRAM).

9. The apparatus of claim 7, wherein the input circuit is a latch.

10. The apparatus of claim 3, wherein the NMOS transistor further comprises a first NMOS transistor, and wherein each inverter further comprises a footer having a second NMOS transistor coupled between the second supply rail and the first NMOS transistor, and wherein the second NMOS transistor is coupled to the controller at its gate so as to receive the control voltage.

11. A method comprising: generating a control voltage in response to a measurement of at least one of process variation, temperature variation, and supply voltage variation to compensate for a hold violation; adjusting the delay of a buffer using the control voltage; providing a first data signal in synchronization with a first clock signal; performing a logic operation on the first data signal so as to generate a second data signal; generating and outputting a third data signal in synchronization with a second clock signal; and buffering at least one of the first and second data signals with the buffer.

12. The method of claim 11, wherein the step of generating the control voltage further comprises:
   determining whether a supply voltage is within a range that may cause hold violations; and
   determining the magnitude of the control voltage to compensate for the hold violation.

13. The method of claim 11, wherein the step of generating the control voltage further comprises:
   determining the process variation; and
   determining the magnitude of the control voltage to compensate for the hold violation.

14. The method of claim 13, wherein the step of determining the process variation further comprises measuring the operation of a ring oscillator.

15. The method of claim 13, wherein the step of determining the process variation further comprises:
   generating a test pattern; and
   determining the process variation based on use of the logic operation on the test pattern.

16. The method of claim 11, wherein the step of generating the control voltage further comprises:
   determining the temperature variation with a bandgap circuit; and
   determining the magnitude of the control voltage to compensate for the hold violation.

17. An apparatus comprising:
   a first supply rail;
   a second supply rail;
   a third supply rail;
   a first clock tree that is configured to generate a first clock signals from a third clock signal and that is coupled to the first and second supply rails;
   a second clock tree that is configured to generate a second clock signals from the third clock signal and that is coupled to the first and second supply rails;
   an input circuit that is coupled to the first clock tree so as to receive the first clock signal and that is coupled to the first and second supply rails;
   logic that is coupled to the input circuit, the first supply rail, and the second supply rail;
   an output circuit that is coupled to the second clock tree so as to receive the second clock signal and that is coupled to the first and second supply rails;
   a buffer including:
      a first inverter having:
         a first PMOS transistor that is coupled to the first supply rail at its source and that is coupled to the at least one of the input circuit and the logic at its gate; and
         a first NMOS transistor that is coupled to the gate of the PMOS transistor at its gate, that is coupled to the drain of the first PMOS transistor at its drain, and that is coupled to the second supply rail at it source; and
      a second inverter having:
         a second PMOS transistor that is coupled to the first supply rail at its source, that is coupled the drain of the first PMOS transistor at its gate, and that is coupled to at least one of the logic and the output circuit at its drain; and
         a second NMOS transistor that is coupled to the gate of the second PMOS transistor at its gate, that is coupled to the drain of the second PMOS transistor at its drain, and that is coupled to the second supply rail at it source;

a controller that is configured to generate a control voltage in response to a measurement of at least one of process variation, temperature variation, and supply voltage variation and that is coupled to provide the control voltage to the buffer so as to adjust the delay of at least one of the first and second inverters.

18. The apparatus of claim 17, wherein the controller is coupled to provide the control voltage to the body of the first and second PMOS transistors.

19. The apparatus of claim 17, wherein the first inverter further comprises a third PMOS transistor coupled between the first supply rail and the first PMOS transistor, and wherein the third PMOS transistor is coupled to the controller at its gate so as to receive the control voltage, and wherein the second inverter further comprises a fourth PMOS transistor coupled between the first supply rail and the second PMOS transistor, and wherein the fourth PMOS transistor is coupled to the controller at its gate so as to receive the control voltage.

20. The apparatus of claim 17, wherein the first inverter further comprises a third NMOS transistor coupled between the second supply rail and the first NMOS transistor, and wherein the third NMOS transistor is coupled to the controller at its gate so as to receive the control voltage, and wherein the second inverter further comprises a fourth NMOS transistor coupled between the second supply rail and the second NMOS transistor, and wherein the fourth NMOS transistor is coupled to the controller at its gate so as to receive the control voltage.

21. The apparatus of claim 19, wherein the controller further comprises:
    a voltage measurement circuit that is configured to measure the supply voltage variation on the first supply rail; and
    an adjustment circuit that is coupled to the voltage measurement circuit, wherein the adjustment circuit is configured to adjust the control voltage so as to slow each inverter the voltage on the first supply rail is within a range that may cause hold violations.

* * * * *